United States Patent [19]
Parent

[11] Patent Number: 5,258,170
[45] Date of Patent: Nov. 2, 1993

[54] PROCESS FOR PRODUCING SILICON CARBIDE PLATELETS

[75] Inventor: Luc Parent, Chicoutimi, Canada

[73] Assignee: Alcan International Limited, Montreal, Canada

[21] Appl. No.: 731,116

[22] Filed: Jul. 15, 1991

Related U.S. Application Data

[63] Continuation-in-part of Ser. No. 591,431, Oct. 1, 1990, Pat. No. 5,173,283.

[51] Int. Cl.$^5$ .............. C01B 31/36; C30B 25/00; C30B 29/36
[52] U.S. Cl. .................. 423/345; 501/88; 156/603
[58] Field of Search .......... 423/344, 345; 501/88; 156/603, DIG. 64; 437/100

[56] References Cited

U.S. PATENT DOCUMENTS

| | | | |
|---|---|---|---|
| 3,025,192 | 3/1962 | Lowe | 148/33 |
| 4,756,895 | 7/1988 | Boecker et al. | 423/345 |
| 4,906,324 | 3/1990 | Weaver et al. | 156/610 |
| 4,915,924 | 4/1990 | Nadkarni et al. | 423/345 |
| 4,948,573 | 8/1990 | Nadkarni et al. | 423/291 |
| 4,981,665 | 1/1991 | Boecker et al. | 423/345 |
| 4,983,553 | 1/1991 | Dunn et al. | 501/96 |
| 5,080,879 | 1/1992 | Nadkarni et al. | 423/345 |
| 5,116,679 | 5/1992 | Nadknari et al. | 428/367 |

FOREIGN PATENT DOCUMENTS

| | | |
|---|---|---|
| 0353052 | 1/1990 | European Pat. Off. |
| 0371770 | 6/1990 | European Pat. Off. |
| 60-155587 | 8/1985 | Japan |
| 61-046403 | 10/1986 | Japan |
| NI-51950 | 11/1991 | Taiwan |

OTHER PUBLICATIONS

Bootsma et al., J. of Crystal Growth 8(1971) pp. 341-353.

*Primary Examiner*—Olik Chaudhuri
*Assistant Examiner*—Ken Horton
*Attorney, Agent, or Firm*—Cooper & Dunham

[57] ABSTRACT

A process for producing silicon carbide platelets having a size of 20 μm or less, and the platelets so produced. The process comprises reacting particles of carbon from a source containing less than 0.2% by weight of iron, with silica or a silica precursor at a temperature in the range of 1800°-2100° C. under an inert atmosphere in the presence of 0.2-10% by weight of an oxide or oxide precursor of Ca, Mg, Al, W, Ce or Cu; 0.1-10% by weight of boron, relative to the weight of $SiO_2$, and preferably 0.1-10% by weight of the reaction mixture of alpha silicon carbide particles having a size of 5 μm or less. The carbon is preferably in the form of particles of less than 50 μm and the silica or precursor is preferably in the form of particles of less than about 45 μm. The weight ratio of silica to carbon is greater than 1.76:1. The carbon source is preferably a pure form of carbon, e.g. graphite or amorphous carbon. The resulting small SiC platelets are substantially unagglomerated, have a high percentage (up to 95%) of small (<20 μm) platelets and preferably have an aspect ratio greater than 5. The platelets can be used as reinforcements for ceramic, metal and polymeric matrix materials.

2 Claims, 4 Drawing Sheets

PROCESS FOR PRODUCING SILICON CARBIDE PLATELETS

CROSS-REFERENCE TO RELATED APPLICATION

This application is a continuation-in-part of application Ser. No. 07/591,431 filed Oct. 1, 1990, now U.S. Pat. No. 5,173,283.

BACKGROUND OF THE INVENTION

I. Field of the Invention

This invention relates to a process for preparing silicon carbide platelets, to the platelets thus formed and to the use of the platelets for particular applications.

II. Description of the Prior Art

Silicon carbide in the form of whiskers, i.e. single crystals grown primarily in one dimension, can be used as reinforcing materials for matrices made of various materials, particularly ceramics and metals. However, silicon carbide whiskers are suspected of being a health hazard because, like asbestos fibres, they easily become airborne and can be ingested by humans or animals. There is therefore a need for an alternative to silicon carbide whiskers that offers similar reinforcing effects without the associated risks.

Silicon carbide platelets have come under consideration as alternatives to whiskers for matrix reinforcement. Silicon carbide "platelets" are single crystals of SiC having two dimensions appreciably greater than the third. Generally, platelets have an aspect ratio (i.e. length or width to thickness) greater than 3 and preferably greater than 5. Unfortunately, platelets produced by the conventional method of reacting silica and carbon at high temperature are generally highly agglomerated and cannot easily be separated. Agglomerated platelets are not very useful as reinforcing materials because they remain in clumps in the matrix and are difficult to disperse. Moreover, the resulting platelets tend to be thicker than desired for an optimum reinforcing effect.

For silicon carbide platelets to be useful in applications such as the reinforcement of ceramic or metal matrix composites, it is believed that they must possess specific attributes, namely:

(a) they must be substantially completely unagglomerated;
(b) the size should preferably be less than 50 $\mu$m, and more preferably less than 30 $\mu$m;
(c) the aspect ratio (width/thickness) should desirably be greater than 5 (preferably 5-8), at a diameter of 10-20 $\mu$m.

In commonly-assigned co-pending U.S. Pat. No. 5,080,879 (the disclosure of which is incorporated herein by reference), a process is described for producing single platelets of SiC suitable for matrix reinforcement. The process involves the reaction of particles of a non-graphitizable form of hard carbon (e.g. Pennsylvania anthracite) containing 0.5-1.5% by weight of aluminum and at least 0.2% by weight of iron, with silica or a silica precursor at a temperature in the range of 1900°-2100° C. under an inert atmosphere. If the carbon contains 0.2-1.0% by weight of iron, 0.1-10% by weight of boron, relative to the weight of $SiO_2$, is required in the reaction mixture (if not already present as an impurity in other starting materials) in order to ensure proper growth of platelets. The resulting particles have an average size of less than 50 $\mu$m and an aspect ratio greater than 5. While these particles have proven to be very useful for the intended purpose, most of the platelets (about 97%) have a size greater than 20 $\mu$m and I have now found that an even more effective reinforcing effect can be obtained if the majority of the platelets have a size of less than 20 $\mu$m.

There is therefore a need for an improved process for producing smaller unagglomerated silicon carbide platelets in high yield.

OBJECTS OF THE INVENTION

Accordingly, an object of the present invention is to provide a process for producing, in good yield, substantially unagglomerated silicon carbide platelets having a large proportion of crystals in the size range of less than 20 $\mu$m and preferably having aspect ratios greater than 5, suitable for reinforcing matrix materials, as well as for other purposes.

Another object of the invention, at least in preferred forms of the invention, is to produce silicon carbide platelets of high purity.

SUMMARY OF THE INVENTION

According to one aspect of the invention, there is provided a process for producing silicon carbide platelets having a size less than about 20 $\mu$m, which comprises: heating a reaction mixture comprising carbon or a carbon precursor containing less than 0.2% by weight of iron and silica or a silica precursor at a temperature of 1800° to 2100° C. under an inert atmosphere in the presence, as part of said reaction mixture, of: 0.1-10% by weight of $B_2O_3$ or a precursor thereof based on the weight of the silica; and 0.2-10% by weight, based on the weight of said reaction mixture, of an oxide or oxide precursor of at least one element selected from the group consisting of Ca, Mg, Al, W, Ce and Cu; the ratio of the weight of silica to carbon, exclusive of impurities, being greater than 1.76.

The invention also relates to the SiC platelets produced by the process and composite materials reinforced with the platelets.

The process of the invention results in the production of platelets having a high proportion (usually 80-95% of the product yield) of SiC platelets of size less than 20 microns and aspect ratios in the range of 5-8.

It should be noted that the amounts of any impurities mentioned in the present invention are calculated as the elements themselves but they may be present in the form of compounds such as oxides and carbides.

DETAILED DESCRIPTION OF THE INVENTION

Figure 1:
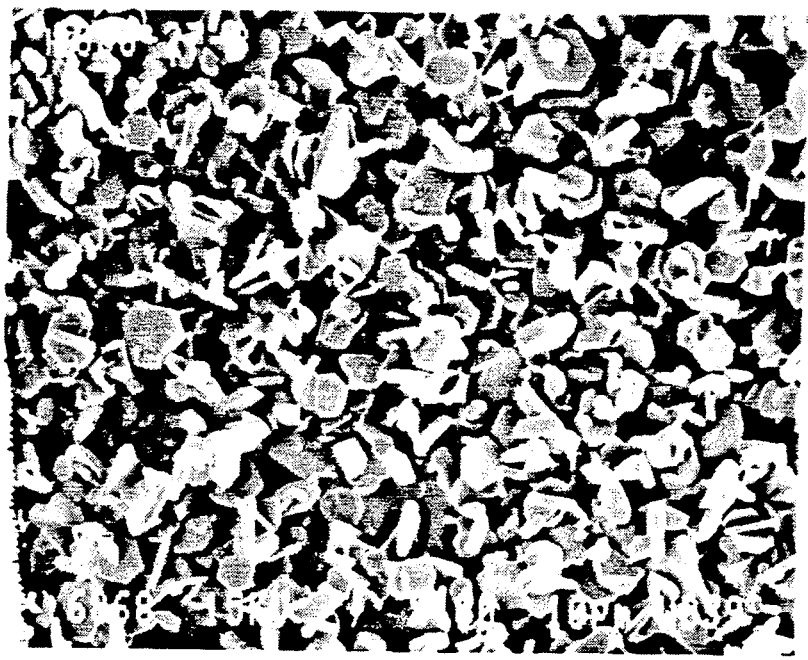
FIGS. 1-7 are photomicrographs at various high magnifications of SiC products produced according to the Examples below.

While the invention of our U.S. Pat. No. 5,080,879 mentioned above requires the use of a non-graphitizable form of hard carbon (e.g. Pennsylvania anthracite) containing 0.5-1.5% by weight of aluminum and at least 0.2% by weight of iron, it has now unexpectedly been found that other sources of carbon (particularly quite pure sources, e.g. those containing up to 99.999% or more of carbon) may be employed instead, provided that the reaction of the carbon and silica is carried out in the presence of at least one oxide or oxide precursor of calcium, magnesium, aluminum, tungsten, cerium or copper, in addition to boron and preferably silicon carbon particles of less than 5 microns in size. The advantage is that, by using a purer source of carbon as one of the starting materials, purer silicon carbide platelets are produced. In particular, by using a source of carbon which contains less than 0.2% by weight of iron, and preferably substantially no iron, contamination of the platelets by iron (which for some applications has to be leached from the platelets before use) can be avoided.

The sources of carbon which may be used in combination with one or more of the oxides mentioned above include pure graphite and amorphous carbon (e.g. carbon black). The use of amorphous carbon is particularly preferred because it is inexpensive, plentiful and of high purity. However, if desired, any other source of carbon may be employed, even an impure source such as a non-graphitizable form of hard carbon (even anthracite coal), provided the source of carbon contains less than 0.2% by wt. of iron.

The particle size of the carbon source is important in some cases. It is found that platelets may not always be produced when the particles of the carbon source have a size above about 50 $\mu$m. Particles in the size range 5 to 50 $\mu$m are preferred.

Any suitable source of silica can be employed for the reaction of the invention but amorphous silica, e.g. fume silica obtained from the ferro-silicon industries, is preferred. Alternatively, a silica precursor, i.e. a material that is converted to silica under the reaction conditions, can be employed. Examples of silica precursors are organosilicon compounds such as triethoxy-silane. The particle size of the silica or silica precursor is preferably less than 45 $\mu$m.

Suitable fume silica products can be obtained from SKW (Beacancour, Canada) and Elkem Industries (Norway). Fume silica contains impurities which may help to catalyse the platelet formation. The compositions of two fume silica products useful in the present invention are shown in Table 1 below, in which percentages are by weight:

TABLE 1

|  | PRODUCT FROM SKW | PRODUCT FROM ELKEM |
| --- | --- | --- |
| % C | 1-2 | 1-2 |
| % $Fe_2O_3$ | 0.15-0.40 | 0.05-0.10 |
| % $Al_2O_3$ | 0.60-1.00 | <0.1 |
| % CaO | 0.40 | 0.3 |
| % $K_2O$ | 0.70-1.00 | 0.5 |
| % $SiO_2$ | balance | balance |

The silica source also preferably has an iron content of less than 0.2% by weight to reduce contamination of the SiC platelets.

The oxides or precursors of the elements Ca, Mg, Al, W, Ce or Cu should be present in the reaction mixture in an amount of about 0.2 to 10% by weight of the total weight of the reaction mixture. When precursors of the oxides are employed, these should be compounds which yield the corresponding oxide under the reaction conditions. Carbonates, acetates and nitrates are examples of suitable precursor compounds. The oxide or oxide precursor of the stated elements is preferably present in the reaction mixture in the form of particles having a size of 20 micrometres or smaller and is preferably thoroughly mixed with the other starting materials before the reaction is commenced.

If the carbon used in the present invention contains aluminum, calcium or a precursor of one of the other oxides mentioned above, the reaction mixture will already contain an oxide of one of the required elements without separate addition. An impure form of carbon which has been found to be effective is one containing 0.5-1.5% by weight of aluminum. When using such starting materials, therefore, it is unnecessary to use additional amounts of the stated oxides or precursors unless a supplement is required to ensure that the amount falls within the stated range. Consequently, these oxides or precursors need be added to the reaction mixture only when they are not already present in the starting materials in the specified quantities, e.g. when using a substantially pure source of carbon.

Boron is also an important element in the reaction mixture required for the formation of small particles. The invention requires the presence of boron, preferably as the oxide or a precursor thereof, in the reaction mixture in an amount in the range of about 0.1 to 10% by weight of the amount of silica. Boron oxide or a precursor, if not already present in the starting materials, can simply be added to the mixture of starting materials.

It has also been found that the presence of particles of alpha silicon carbide of 5 $\mu$m or less in size during the reaction of silicon, carbon and the other materials mentioned above often results in a very substantial increase in the proportion of very small (less than 20 $\mu$m) platelets in the product. Thus, the presence of such particles often results in a substantial improvement of the yield of small platelets which have a greatly improved reinforcing effect when used for metal, ceramic or polymeric matrix reinforcement. Such particles should preferably be added to the reaction mixture when a high yield of very small platelets is desired and, when employed, should preferably be used in an amount of 0.1 to 10% by weight of the total weight of the reaction mixture. If an amount of less than 0.1% by weight is employed, an improvement in the yield of SiC platelets having a size of less than 20 $\mu$m is not obtained. If the amount is more than 10% by weight, the product tends to be in agglomerated form, which is undesirable. The most preferred amount of alpha SiC is between 0.25 and 1.0% by weight of the reaction mixture.

The added alpha silicon carbide particles should have a particle size of less than 5 $\mu$m. Ideally, the size range is submicronic up to 5 $\mu$m. The particles can be obtained, for example, by crushing larger alpha SiC platelets or particles made by the process of the present invention, the process of the commonly-assigned application mentioned above, or any other process, and then classifying the crushed particles to separate the particles in the desired size range.

While the mechanism by which the particles of alpha SiC affect the size range of the product platelets is not precisely known, their presence during the reaction controls the growth of the product particles so that the majority are less than 20 $\mu$m in size, and a substantial portion are less than 5 $\mu$m in size. The added SiC particles do not appear in the product and thus presumably become part of the product platelets.

The reaction of the present invention can be carried out at a lower temperature than that required for the formation of SiC by conventional processes and it is believed that this favours the formation of platelets. The lower reaction temperature may be possible due to the presence of impurities either in the starting materials or in the form of the additional materials added to the starting materials. In any event, the reaction of the invention may be carried out at temperatures in the range of 1800°–2100° C., preferably 1850°–2100° C., under an inert atmosphere.

The reaction generally requires heating times in the range of 15 minutes to 6 hours, and is normally complete after 1 to 2 hours.

A particularly preferred product can be produced when a reaction mixture comprising about 2% by weight of the total reaction mixture of CaO or a precursor, about 1.55 parts by weight of pure carbon, about 3 parts by weight of $SiO_2$, 0.01 to 0.1 parts of $B_2O_3$ and about 0.025 parts by weight of alpha SiC crystals is heated under an inert atmosphere at about 2050° C. for about 2 hours.

It is to be noted that the process of the present invention requires the presence of excess oxygen in the reactants during the reaction step. This is ensured by using excess $SiO_2$ over that required stoichiometrically to produce SiC by the reaction with the available carbon. This requires a weight ratio of $SiO_2$ to C exceeding 1.76. These ratios refer to pure $SiO_2$ and C, exclusive of any impurities; i.e. for C, this is not necessarily the weight of the carbon source if it is not pure, but rather the weight of the C in the carbon sources. During the reaction, the excess $SiO_2$ is converted into SiO which then reacts with the impurities to form a liquid phase at temperatures near 2000° C., which helps to promote synthesis of the platelets. Without the excess $SiO_2$, no platelets are produced. The presence of oxygen is so critical that if the reaction is conducted under an atmosphere of pure nitrogen, no platelets are produced. It is found that the $N_2$ replaces the oxygen in the product and thus prevents the formation of the liquid phase. The reaction therefore has to be conducted under an inert atmosphere, such as that formed by a noble gas, e.g. argon. However, nitrogen concentrations up to about 25% by volume can be tolerated without undesirable effects.

Although the silica should be present in stoichiometrical excess, which is the case when the weight ratio is greater than 1.76 as stated, the excess of silica should preferably not be greater than 10% by weight because the excess SiO then tends to block the furnace. The maximum weight ratio of silica to carbon in the starting materials is generally 1.9.

If purification of the SiC particles produced by the invention is required despite the use of relatively pure starting materials, the silicon carbide products can be purified by the following procedure so that they can be used more effectively for such purposes as reinforcements for ceramic matrix composites, for which purpose in particular impurities are generally unacceptable because they form glassy phases in the final products.

The impurities in the silicon carbide product produced by the present invention, such as Fe, Al, Ca, B, etc., are normally present to a large extent on the external surfaces of the platelets, often at the boundary between two adjacent particles, and are usually in the form of silicides. Although the impurities, being on the surface, are accessible to acid leaching, they cannot be removed by HCl (which is normally used for such purposes). It is believed that this is because the impurities are protected by a protective layer of $SiO_2$ during the formation process mentioned above. This problem can, however, be overcome by using a combination of HF and HCl or gaseous chlorine, because the HF dissolves the $SiO_2$ and the impurities become accessible to the HCl or $Cl_2$. For example, the purification procedure can be carried out by first leaching the product in hydrofluoric acid at a temperature of about 70° C. to remove the protective coating of $SiO_2$, and then treating the resulting product with either hydrochloric acid or with gaseous chlorine to remove the exposed impurities. When iron is the impurity, the reaction involved is given below:

$$FeSi + 3HCl + 6HF \rightarrow FeCl_3 + H_2SiF_6 + 3.5H_2 \uparrow$$

As mentioned earlier, the need for this purification step, as far as it relates to iron compounds acting as impurities, can be avoided if a substantially pure form of carbon and a low iron-content silica source is used.

As noted above, the platelets produced by the present invention can be used in particular for the reinforcement of ceramic matrix or metal matrix composites. Any suitable matrix material may be reinforced in this way, examples being alumina, mullite, silicon nitride, etc. Reinforcement of these materials using the platelets of the present invention can produce products having mechanical properties similar to those obtained with SiC whiskers due to the high aspect ratios and small size (less than 20 $\mu$m) of the platelets, while avoiding the health risks attendant on the use of whiskers.

The platelets produced by the present invention can be used as such for matrix reinforcement or the small percentage of platelets larger than 20 $\mu$m may first be removed by screening, air classification, etc. to avoid their adverse effect on the mechanical properties of the material.

The invention is illustrated further by the following non-limiting Examples and Comparative Examples.

COMPARATIVE EXAMPLE 1

A mixture of $SiO_2$:graphite:$B_2O_3$:SiC seeds in the weight proportion 3:1.55:0.1:0.025 was prepared and heated in argon at 2050° C. for 2 hours. The silica (Atomergic Chemetals Corp.) used was very pure (99.999%) and particles were smaller than 325 mesh. The graphite powder (−100 mesh), from Jonhson Matthew Electronic, was also very pure (99.9995%). The resulting platelets were too large but of good purity. The impurity contents of resulting platelets are given below:

| Element | % in Weight |
| --- | --- |
| Fe | 0.008 |
| Ti | less than 0.001 |
| Ca | 0.002 |
| K | less than 0.0002 |
| Al | less than 0.02 |
| Mg | less than 0.005 |
| Ni | less than 0.002 |

EXAMPLE 1

A mixture of $SiO_2$:carbon black:$B_2O_3$:SiC seeds:CaO in the weight proportion 3:1.55:0.1:0.025:0.1 was prepared in ethanol. After the evaporation of ethanol on a hot plate, the mixture was calcined at 1950° C. for 2 hours in argon. Small platelets were obtained and are shown in FIG. 1. The carbon used for this experiment was a amorphous carbon obtained from Cancarb LTD. It was a very pure carbon (99.98%) with a low ash content (0.010%). The mean size of the resulting particles was 270 nm. The impurity contents are given below, the impurities coming from the silica which was not pure:

| Element | % in Weight |
|---|---|
| Fe | 0.098 |
| Ti | 0.007 |
| Ca | 0.400 |
| Al | 0.26 |
| Ni | 0.002 |

FURTHER EXAMPLES and COMPARATIVE EXAMPLES

Numerous different elements were added to silica-graphite mixtures as indicated below but only few were effective in forming platelets of the desired size. The most effective mixtures are the ones where a combination of boron oxide and another material was added at the same time. No α-SiC particles were added in these experiments because they would have masked the effects of the materials being tested.

The methodology used in the following Examples and Comparative Examples was the same for all. The silica (99.999%) and the graphite (99.999%) powders were the same as for Comparative Example 1. The composition of the mixture was silica:graphite:impurity in the weight proportion of 3:1.55:0.09. The impurities were added on the basis of the weight of the oxide. The proportion is given for each example under the compound. The calcination was done at 2050° C. for 2 hours in flowing argon.

COMPARATIVE EXAMPLE 2

The ratio of starting materials was as follows:

$SiO_2$ (pure):C (pure graphite)
3:1.55

The reaction temperature was at 2050° C. for two hours. No platelets were obtained.

COMPARATIVE EXAMPLE 3

The ratio of starting materials was as follows:

$SiO_2$ (pure):C (pure graphite):$B_2O_3$
3:1.55:0.09

The reaction was carried out at 2050° C. for 2 hours. The addition of boron produced platelets but they were large and the product was not completely transformed.

COMPARATIVE EXAMPLE 4

The ratio of starting materials was as follows:

$SiO_2$ (pure):C (pure graphite):$Al_2O_3$
3:1.55:0.09

The reaction was carried out at 2050° C. for 2 hours. The addition of alumina to the reaction mixture of Comparative Example 2 increased the size of crystals and gave them a platy shape with a low aspect ratio. The resulting crystals were thus unsuitable.

EXAMPLE 2

The ratio of starting materials was as follows:

$SiO_2$ (pure):C (pure graphite):$B_2O_3$:CaO
3:1.55:0.1:0.09

Figure 2:
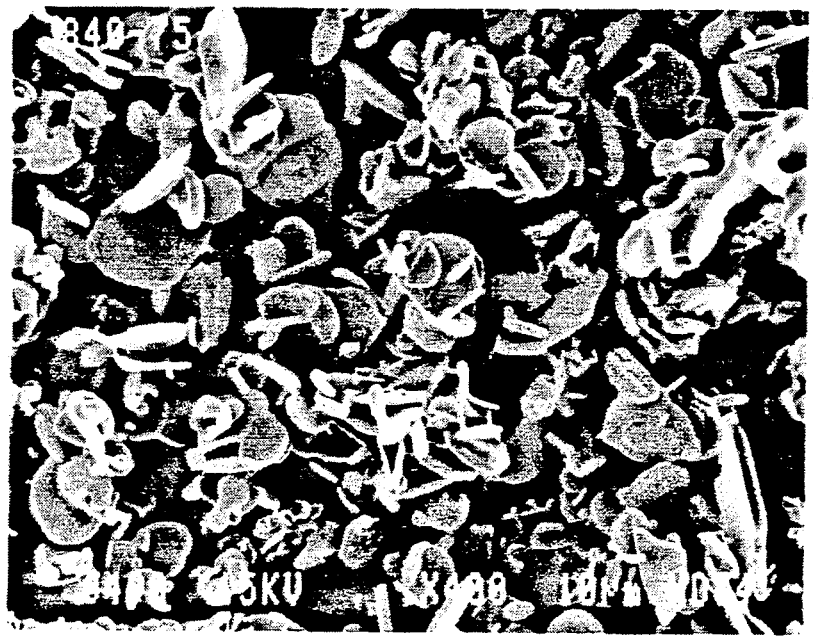

This combination gave a complete transformation into platelets which also had a roundish shape (FIG. 2).

EXAMPLE 3

The ratio of starting materials was as follows:

$SiO_2$ (pure):C (pure graphite):$B_2O_3$:$CeO_2$
3:1.55:0.1:0.09

Figure 3:

This combination of Ce and B also gave a complete transformation (FIG. 3).

EXAMPLE 4

The ratio of starting materials was as follows:

$SiO_2$ (pure):C (pure graphite):$B_2O_3$:$Al_2O_3$
3:1.55:0.1:0.09

Figure 4:

The quality of the product seemed to be slightly less good than for Ca or Ce (FIG. 4) but the platelets were acceptable.

EXAMPLE 5

The ratio of starting materials was as follows:

$SiO_2$ (pure):C (pure graphite):$B_2O_3$:WO
3:1.55:0.1:0.09

Figure 5:
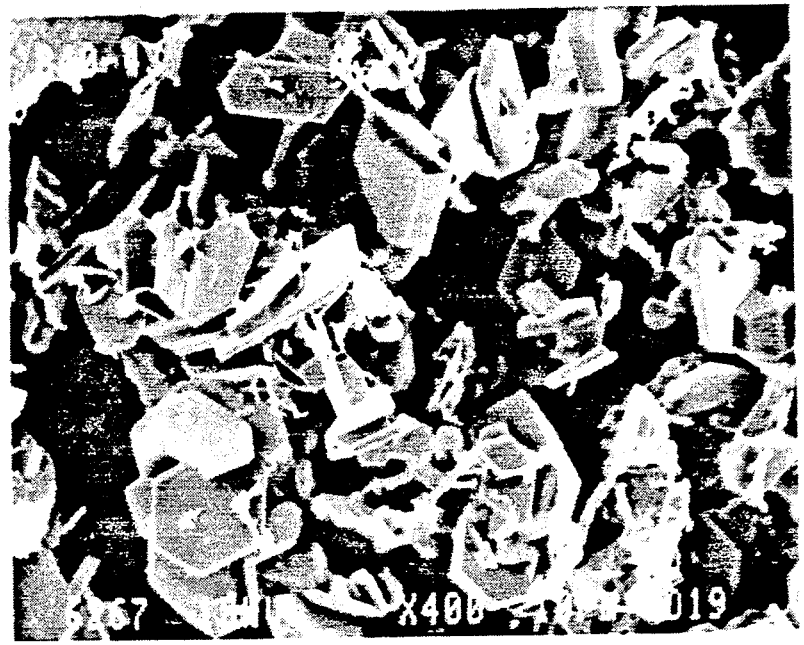

The product obtained with this combination was slightly different, the platelets were more angular in shape (FIG. 5) but were acceptable.

EXAMPLE 6

The ratio of starting materials was as follows:

$SiO_2$ (pure):C (pure graphite):$B_2O_3$:MgO
3:1.55:0.1:0.09

Figure 6:

The product was less uniform than the other combination but was still acceptable. There were big platelets and also agglomerates (FIG. 6).

EXAMPLE 7

The ratio of starting materials was as follows:

$SiO_2$ (pure):C (pure graphite):$B_2O_3$:CuO
3:1.55:0.1:0.09

Figure 7:

This combination gave the largest crystals (FIG. 7) but they were still acceptable.

What I claim is:

1. A process for producing silicon carbide platelets having a size less than about 20 μm, which comprises forming a reaction mixture consisting of about 2% by weight of said reaction mixture of CaO or a precursor thereof, about 1.75 parts by weight of pure carbon containing less than 0.2% by wt. of iron, about 3 parts by weight of $SiO_2$, 0.01 to 0.1 parts by weight of $B_2O_3$ and about 0.025 parts by weight of alpha SiC crystals, and heating said reaction mixture under an inert atmosphere at about 2050° C. for about 2 hours.

2. A process for producing silicon carbide platelets having a size less than about 20 μm, which comprises forming a reaction mixture consisting of about 2% by weight of said reaction mixture of CaO or a precursor thereof, about 1.75 parts by weight of pure carbon containing less than 0.2% by wt. of iron, about 3 parts by weight of $SiO_2$, 0.01 to 0.1 parts by weight of $B_2O_3$ and about 0.025 parts by weight of alpha SiC crystals, and heating said reaction mixture under an inert atmosphere at about 1800°–2100° C. for about 2 hours.

* * * * *